(12) United States Patent
Nam et al.

(10) Patent No.: US 10,672,847 B2
(45) Date of Patent: Jun. 2, 2020

(54) DISPLAY DEVICE INCLUDING TOUCH SENSORS AND METHOD OF MANUFACTURING THE SAME

(71) Applicant: LG Display Co., Ltd., Seoul (KR)

(72) Inventors: Seung-Hee Nam, Paju-si (KR); Jung-Ho Bang, Paju-si (KR); Jung-Sun Beak, Paju-si (KR); Seong-Joo Lee, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/208,892

(22) Filed: Dec. 4, 2018

(65) Prior Publication Data
US 2019/0172882 A1 Jun. 6, 2019

(30) Foreign Application Priority Data
Dec. 4, 2017 (KR) .......................... 10-2017-0165408

(51) Int. Cl.
*H01L 27/32* (2006.01)
*G06F 3/044* (2006.01)
*G06F 3/041* (2006.01)
*G02F 1/1333* (2006.01)

(52) U.S. Cl.
CPC ...... *H01L 27/3248* (2013.01); *G02F 1/13338* (2013.01); *G02F 1/133308* (2013.01); *G06F 3/044* (2013.01); *G06F 3/0412* (2013.01); *G06F 3/0418* (2013.01); *G06F 3/0443* (2019.05); *H01L 27/3276* (2013.01); *G02F 2001/133357* (2013.01); *G06F 2203/04103* (2013.01); *H01L 2227/323* (2013.01)

(58) Field of Classification Search
CPC ........... H01L 27/3248; H01L 2227/323; G02F 2001/133357; G02F 1/133308; G02F 1/13338; G06F 3/0412; G06F 3/0418; G06F 3/044
USPC ........................................................ 345/173
See application file for complete search history.

(56) References Cited

U.S. PATENT DOCUMENTS

| | | | |
|---|---|---|---|
| 2005/0253171 A1* | 11/2005 | Kang | ................... H01L 27/3246 257/211 |
| 2016/0378233 A1* | 12/2016 | Huo | ..................... G06F 3/0412 345/174 |
| 2017/0351379 A1* | 12/2017 | Chen | ................... H01L 27/1248 |
| 2018/0210587 A1* | 7/2018 | Zhang | ................... G06F 3/0412 |
| 2018/0314120 A1* | 11/2018 | Peng | ................... H01L 27/0288 |

* cited by examiner

*Primary Examiner* — Mark Edwards
(74) *Attorney, Agent, or Firm* — Morgan, Lewis & Bockius LLP

(57) ABSTRACT

A display device includes: thin film transistors (TFTs) on a substrate, pixel electrodes (PEs) respectively connected to the TFTs, common electrode blocks (CEBs) on the substrate, each CEB forming an electric field with a respective PE, touch sensing lines (TSLs) respectively connected to the CEBs, a lower planarization layer (PL) between the TFTs and the TSLs, an upper PL between the TSLs and one of: the PEs and the CEBs, an upper protective film between the PEs and the CEBs, and pixel contact holes extending through the lower PL and the upper PL to expose respective drain electrodes of the TFTs, wherein a side surface of each of the lower PL and the upper PL, exposed through the pixel contact holes, contacts one of: the upper protective film and the PEs.

20 Claims, 14 Drawing Sheets

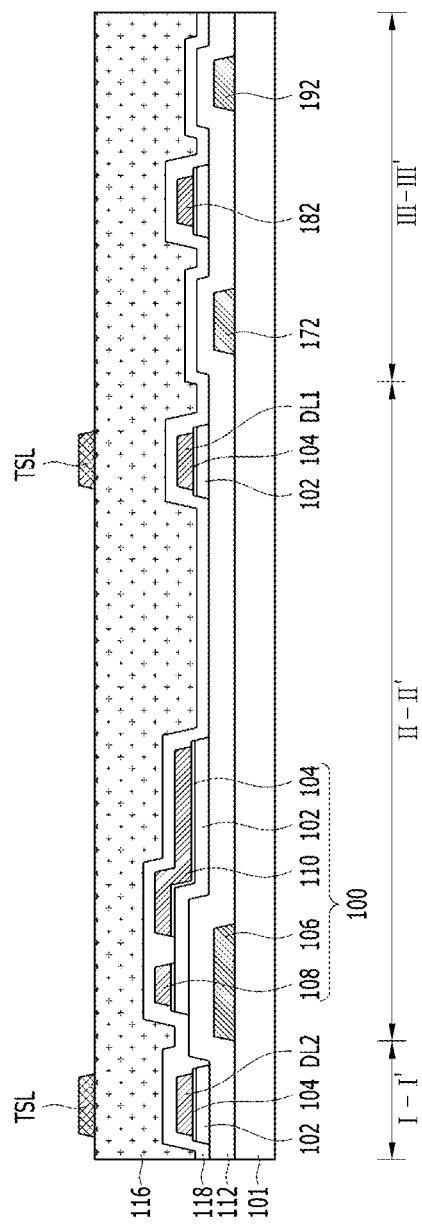

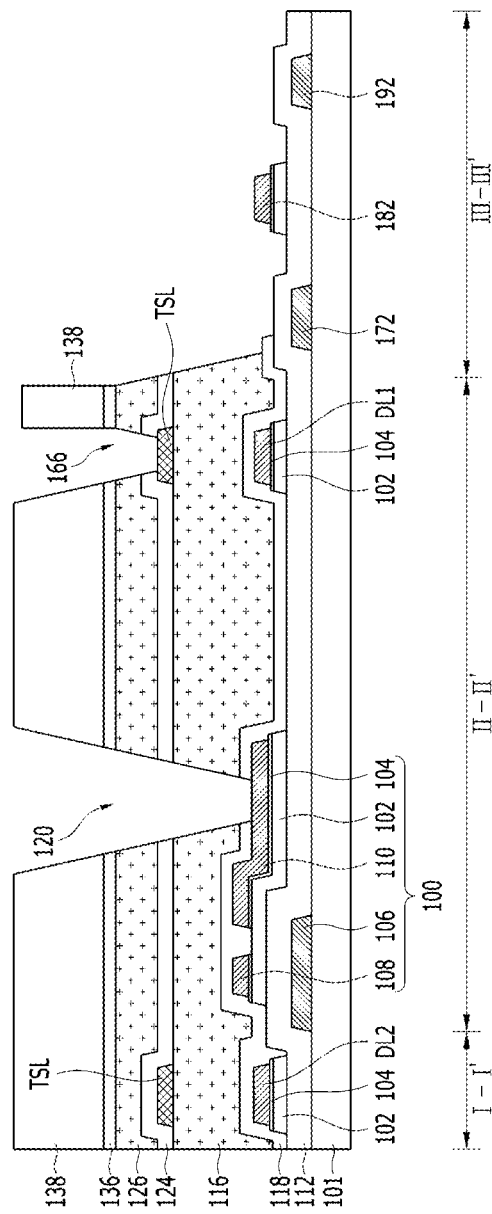

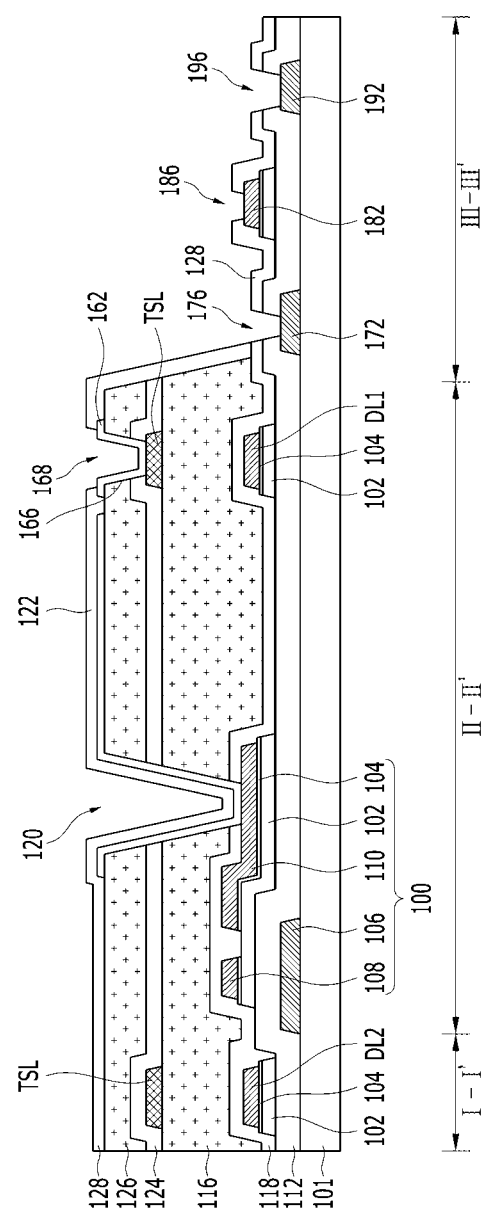

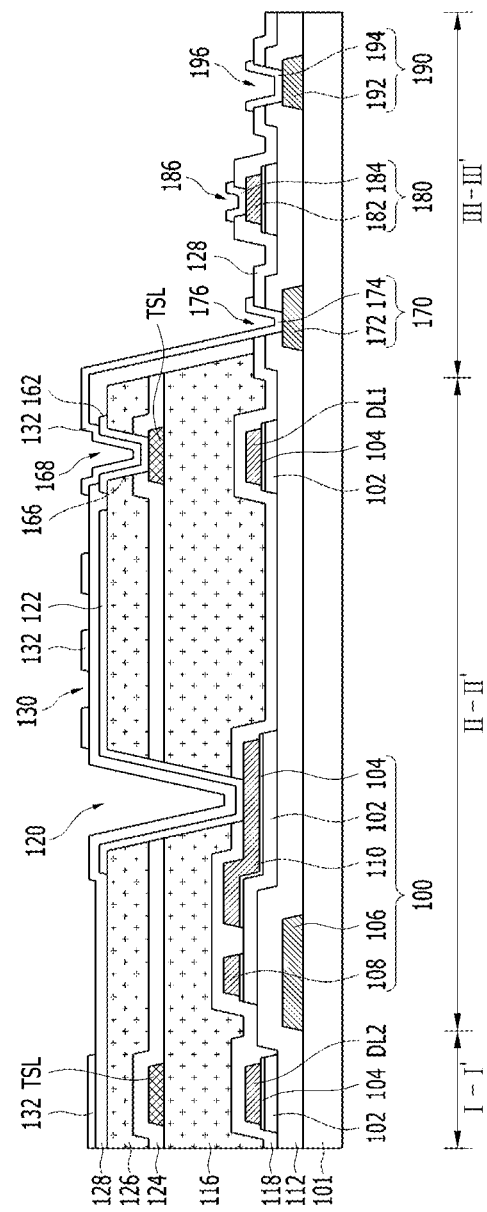

DISPLAY DEVICE INCLUDING TOUCH SENSORS AND METHOD OF MANUFACTURING THE SAME

CROSS-REFERENCE TO RELATED APPLICATION(S)

This application claims the benefit of and priority to Korean Patent Application No. 10-2017-0165408, filed on Dec. 4, 2017, the entirety of which is hereby incorporated by reference.

BACKGROUND

1. Technical Field

The present disclosure relates to an organic light-emitting display device, and more particularly, to a display device having touch sensors which may reduce parasitic capacitance and a method of manufacturing the same.

2. Discussion of the Related Art

A touch panel is one kind of input device that can be provided in a display device, such as a liquid crystal display device, an organic light-emitting display device, or an electrophoretic display device, so that a user may input information by directly contacting a screen using a finger or a stylus pen. Recently, to satisfy a desire for slimness of portable terminals, such as smartphones, tablet portable computers (PCs), etc., demand for a display device, in which touch sensors constituting a touch panel are installed within a display panel of the display device, is increasing.

However, in such a display device having built-in touch sensors, a plurality of electrodes or signal lines of a display panel is arranged around the touch sensors. Unnecessary parasitic capacitances are formed due to these electrodes or signal lines of the display panel. The parasitic capacitances increase a touch driving load and lower accuracy in touch sensing, or, in severe cases, may make sensing touch impossible.

SUMMARY

Accordingly, the present disclosure is directed to a display device including touch sensors and a method of manufacturing the same that substantially obviate one or more of the issues due to limitations and disadvantages of the related art.

An aspect of the present disclosure is to provide a display device including touch sensors that may reduce parasitic capacitance.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided a display device including touch sensors, including: a substrate, a plurality of thin film transistors on the substrate, a plurality of pixel electrodes respectively connected to the a plurality of thin film transistors, a plurality of common electrode blocks on the substrate, each of the plurality of common electrode blocks being configured to form an electric field with respective ones of the plurality of pixel electrodes, a plurality of touch sensing lines respectively connected to the plurality of common electrode blocks, a lower planarization layer between the thin film transistors and the touch sensing lines, an upper planarization layer between the plurality of touch sensing lines and one of: the plurality of pixel electrodes and the plurality of common electrode blocks, an upper protective film between the plurality of pixel electrodes and the plurality of common electrode blocks, and a plurality of pixel contact holes extending through the lower planarization layer and the upper planarization layer to expose respective drain electrodes of the plurality of thin film transistors, wherein a side surface of each of the lower planarization layer and the upper planarization layer, exposed through the plurality of pixel contact holes, contacts one of: the upper protective film and the plurality of pixel electrodes.

In another aspect, there is provided a method of manufacturing a display device, the method including: providing a substrate, providing a plurality of thin film transistors on the substrate, providing a plurality of pixel electrodes respectively connected to the a plurality of thin film transistors, providing a plurality of common electrode blocks on the substrate, each of the plurality of common electrode blocks being configured to form an electric field with respective ones of the plurality of pixel electrodes, providing a plurality of touch sensing lines respectively connected to the plurality of common electrode blocks, providing a lower planarization layer between the thin film transistors and the touch sensing lines, providing an upper planarization layer between the plurality of touch sensing lines and one of: the plurality of pixel electrodes and the plurality of common electrode blocks, providing an upper protective film between the plurality of pixel electrodes and the plurality of common electrode blocks, and providing a plurality of pixel contact holes extending through the lower planarization layer and the upper planarization layer to expose respective drain electrodes of the plurality of thin film transistors, wherein a side surface of each of the lower planarization layer and the upper planarization layer, exposed through the plurality of pixel contact holes, contacts one of: the upper protective film and the plurality of pixel electrodes.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, that may be included to provide a further understanding of the disclosure and are incorporated in and constitute a part of this disclosure, illustrate embodiments of the disclosure and together with the description serve to explain various principles of the disclosure.

FIGS. 5A to 5E are cross-sectional views illustrating a method of manufacturing the display panel shown in FIG. 4.

Figure 1:
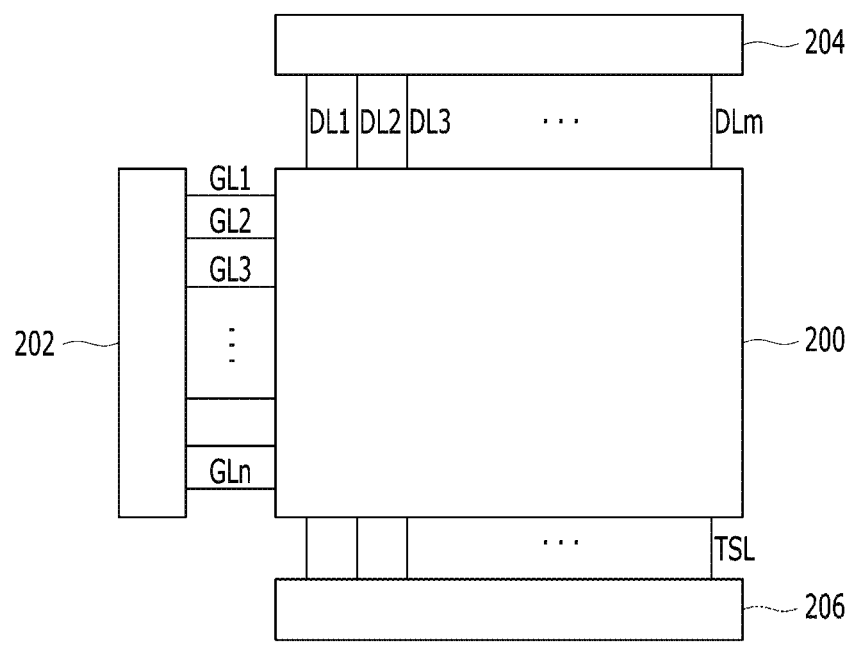
FIG. 1 is a block diagram illustrating a display device including touch sensors in accordance with an example embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the present disclosure is only defined by scopes of claims.

A shape, a size, a ratio, an angle, and a number disclosed in the drawings for describing embodiments of the present disclosure are merely an example. Thus, the present disclosure is not limited to the illustrated details. Like reference numerals refer to like elements throughout. In the following description, when the detailed description of the relevant known function or configuration is determined to unnecessarily obscure an important point of the present disclosure, the detailed description of such known function or configuration may be omitted. In a case where terms "comprise," "have," and "include" described in the present disclosure are used, another part may be added unless a more limiting term, such as "only," is used. The terms of a singular form may include plural forms unless referred to the contrary.

In construing an element, the element is construed as including an error or tolerance range even where no explicit description of such an error or tolerance range. In describing a position relationship, when a position relation between two parts is described as, for example, "on," "over," "under," or "next," one or more other parts may be disposed between the two parts unless a more limiting term, such as "just" or "direct(ly)," is used.

In describing a time relationship, when the temporal order is described as, for example, "after," "subsequent," "next," or "before," a case which is not continuous may be included unless a more limiting term, such as "just," "immediate(ly)," or "direct(ly)," is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms like "first," "second," "A," "B," "(a)," and "(b)" may be used. These terms are merely for differentiating one element from another element, and the essence, sequence, order, or number of a corresponding element should not be limited by the terms. Also, when an element or layer is described as being "connected," "coupled," or "adhered" to another element or layer, the element or layer can not only be directly connected or adhered to that other element or layer, but also be indirectly connected or adhered to the other element or layer with one or more intervening elements or layers "disposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Hereinafter, example embodiments of the present disclosure will be described in detail with reference to the accompanying drawings.

Figure 2:
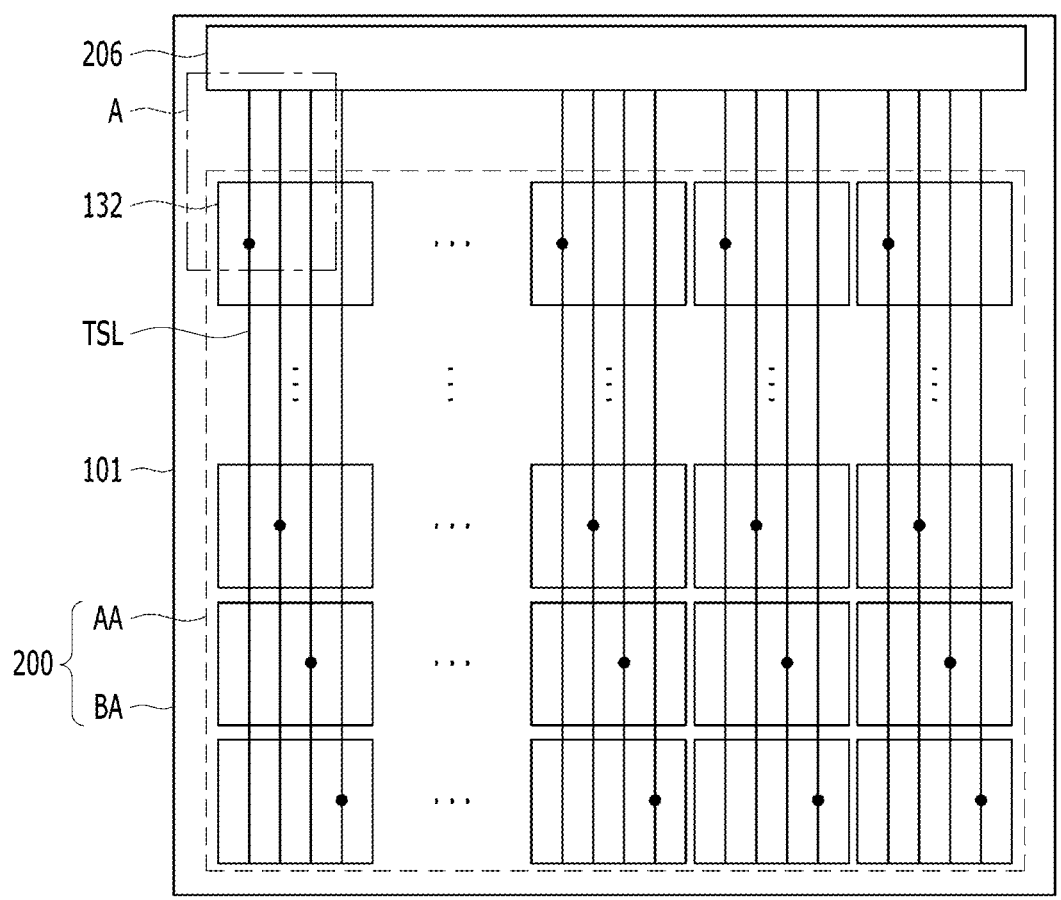
FIG. 2 is a plan view illustrating a display panel including the touch sensors shown in FIG. 1 in more detail.
Figure 3:
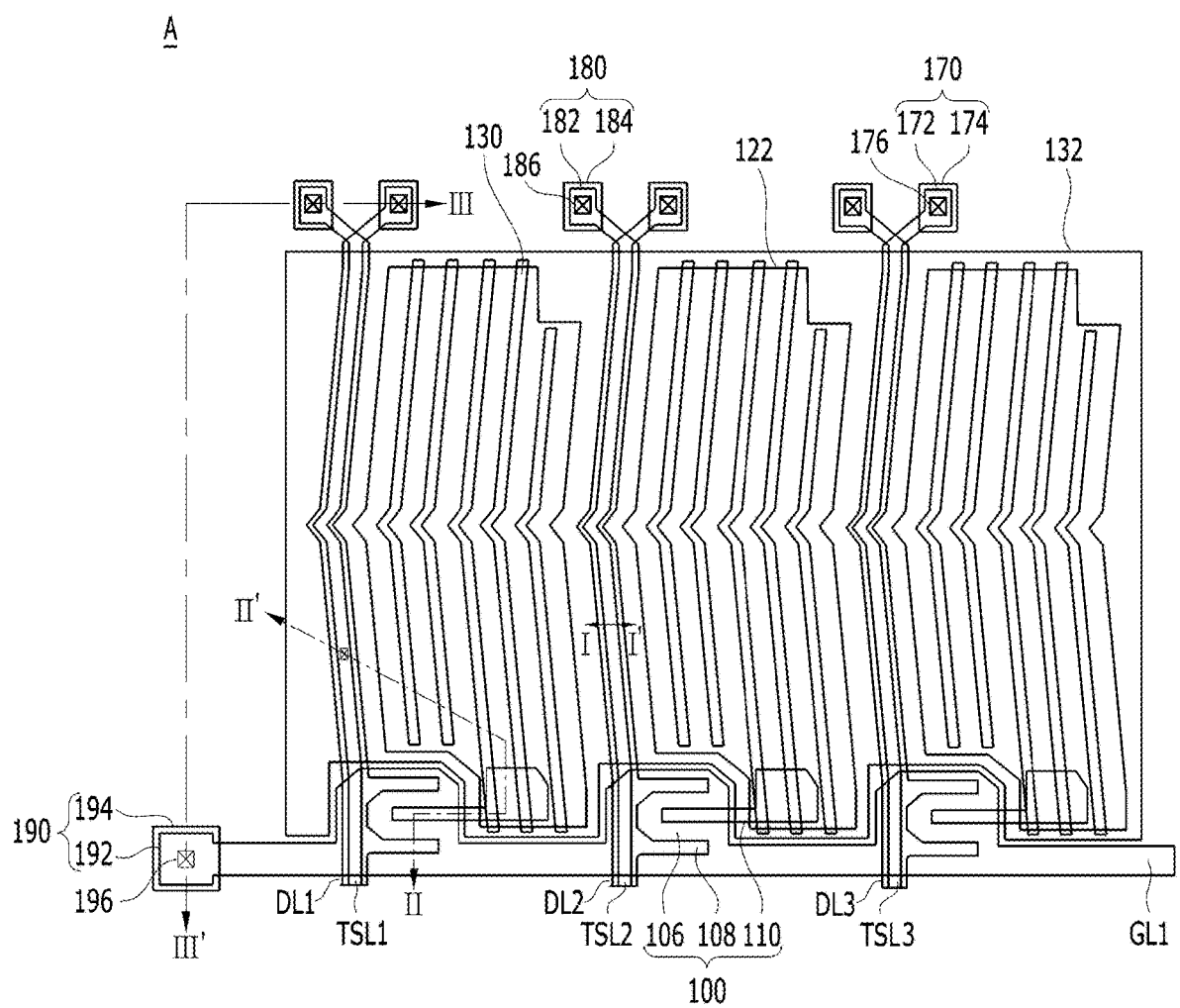
FIG. 3 is an enlarged plan view of portion "A" of FIG. 2.
Figure 4:
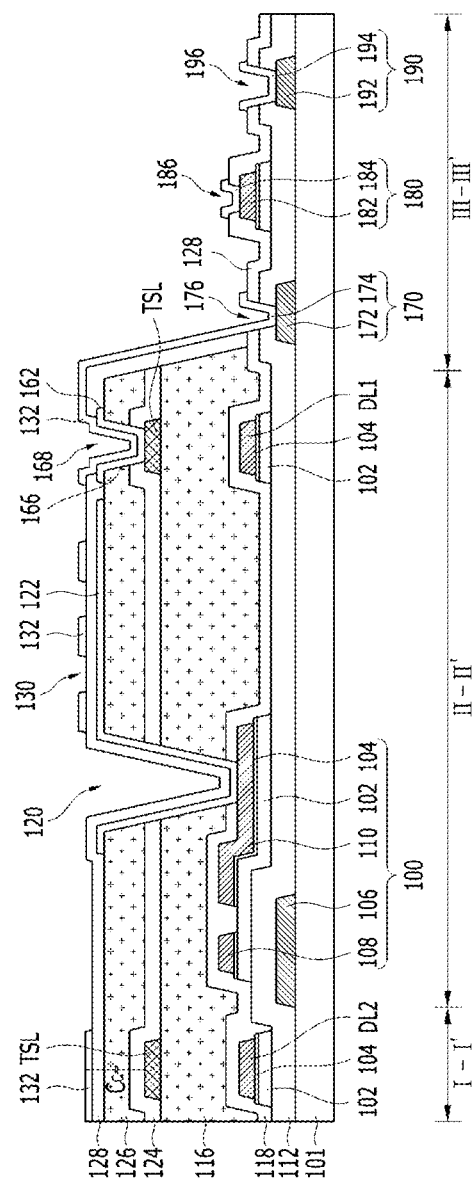
FIG. 4 is a cross-sectional view of the display panel, taken along lines I-I', II-II' and III-III' of FIG. 3.

FIG. 1 is a block diagram illustrating a display device including touch sensors in accordance with an example embodiment of the present disclosure. FIG. 2 is a plan view illustrating a display panel including the touch sensors shown in FIG. 1 in more detail. FIG. 3 is an enlarged plan view of portion "A" of FIG. 2. FIG. 4 is a cross-sectional view of the display panel, taken along lines I-I', II-II' and III-III' of FIG. 3.

The display device shown in FIG. 1 may include a data driver 204, a gate driver 202, a touch driver 206, and a display panel 200. The data driver 204 may convert data from a timing controller (not shown) into analog data voltage, and may supply the analog data voltage to data lines DL in response to a data control signal from the timing controller.

The gate driver 202 may sequentially drive gate lines GL of the display panel 200 in response to a gate control signal from the timing controller. The gate driver 202 may supply a scan pulse of a gate-on voltage to each gate line GL during a scan period of the corresponding gate line GL, and may supply a gate-off voltage to the corresponding gate line GL during remaining periods when other gate lines GL are driven. The gate driver 202 may be formed together with thin films transistors of respective pixels during a process of manufacturing the thin film transistors, and may be located at a non-display area at one side or both sides of a substrate of the display panel 200.

The touch driver 206 may be connected to touch sensing lines TSL of the display panel 200, and thus may receive a user touch signal from the touch sensing lines TSL. The touch driver 206 may detect whether or not user touch occurs and a touch position by sensing change in capacitance due to the user touch.

In the display panel 200, a plurality of pixels may be arranged in a matrix, and may thus display an image. If a liquid crystal panel is used as the display panel 200, the display panel 200 may include a color filter substrate on which a color filter array may be formed, a thin film transistor substrate on which a thin film transistor array may be formed, and a liquid crystal layer provided between the color filter substrate and the thin film transistor substrate.

The display panel 200 may include an active area AA and a bezel area BA at one or more sides of the active area AA, as shown in the example of FIG. 2. A plurality of pads connected to the signal lines GL, DL, and TSL of the active are AA may be in the bezel area BA. That is, gate pads 190, data pads 180 and common pads 170 may be in the bezel area BA, as shown in the examples of FIGS. 3 and 4.

The gate pad 190 may supply a scan pulse generated by the gate driver 202 to the gate line GL. As such, the gate pad 190 may include a gate pad lower electrode 192 and a gate pad upper electrode 194 connected to each other through a gate contact hole 196. The gate pad lower electrode 192 may extend from the gate line GL, and may be connected to the gate line GL. The gate pad lower electrode 192 may be formed of the same material as a gate electrode 106 on a substrate 101. The gate pad upper electrode 194 may be connected to the gate pad lower electrode 192 exposed through the gate contact hole 196 formed through a gate insulating film 112 and an upper protective film 128.

The data pad 180 may supply a data signal generated by the data driver 204 to the data line DL. As such, the data pad 180 may include a data pad lower electrode 182 and a data pad upper electrode 184 connected to each other through a data contact hole 186. The data pad lower electrode 182 may extend from the data line DL, and may be connected to the data line DL. The data pad lower electrode 182 may be formed of the same material as source and drain electrodes 108 and 110. The data pad upper electrode 184 may be connected to the data pad lower electrode 182 exposed through the data contact hole 186 formed through the upper protective film 128.

The common pad 170 may supply a touch signal from the touch sensing line TSL to the touch driver 206. As such, the common pad 170 may include a common pad lower electrode 172 and a common pad upper electrode 174 connected to each other through a common contact hole 176. The common pad lower electrode 172 may be formed of the same material as the gate electrode 106 on the substrate 101. The common pad upper electrode 174 may be connected to the common pad lower electrode 172 through the common contact hole 176 formed through the gate insulating film 112 and the upper protective film 128. The common pad upper electrode 174 may be connected to a common electrode block 132. At least one of the gate driver 202, the data driver 204, or the touch driver 206 may be in the bezel area BA.

A plurality of common electrode blocks 132 and a plurality of touch sensing lines TSL, respectively connecting the common electrode blocks 132 to the touch driver 206, may be in the active area AA. Here, each of the touch sensing blocks TSL may extend in a vertical or horizontal direction, and thus may traverse the common electrode blocks 132. For example, each of the touch sensing blocks TSL may extend in a direction parallel to the data lines DL, and thus may traverse the common electrode blocks 132, which may be in the direction of the data lines DL.

A plurality of the common electrode blocks 132 may be arranged in a first direction parallel to the gate lines GL and in a second direction parallel to the data lines DL. The common electrode blocks 132 may be spaced apart from each other.

The common electrode blocks 132 may be formed by dividing a common electrode of the display device into a plurality of pieces. The common electrode blocks 132 may be operated as common electrodes during an image display period, and may be operated as touch electrodes during a touch sensing period. For example, during the image display period, the common electrode blocks 132 may receive a common voltage supplied through the touch sensing lines TSL. Further, during the touch sensing period, e.g., an image non-display period, the common electrode blocks 132 may supply sensed touch sensing voltages to the touch driver 206 through the touch sensing lines TSL.

Each of the common electrode blocks 132 may have a size corresponding to at least two pixel areas in consideration of a user touch area. Therefore, one common electrode 132 may overlap a plurality of pixel electrodes 122, as shown in the example of FIG. 3. The pixel electrode 122 may be connected to a thin film transistor 100 in each pixel area, prepared by intersection of the gate line GL and the data line DL, as shown in the example of FIG. 4.

The thin film transistor 100 may charge the pixel electrode 122 with a data signal of the data line DL in response to a scan signal of the gate line GL, and may maintain the charged state of the pixel electrode 122. As such, the thin film transistor 100 may include the gate electrode 106 connected to the gate line GL, the source electrode 108 connected to the data line DL, the drain electrode 110 connected to the pixel electrode 122, and a semiconductor layer formed on the gate insulating film 112 to form a channel between the source electrode 108 and the drain electrode 110. Here, the semiconductor layer may include an active layer 102 and an ohmic contact layer 104. The active layer 102 may be formed on the gate insulating film 112 to overlap the gate electrode 106, thus forming the channel between the source and drain electrodes 108 and 110. The ohmic contact layer 104 may be formed on the active layer 102, except for the channel, to form ohmic contact between each of the source and drain electrodes 108 and 110 and the active layer 102. The active layer 102 and the ohmic contact layer 104 may overlap the data line DL and the data pad lower electrode 182, as well as the source and drain electrodes 108 and 110.

A lower protective film 118, a lower planarization layer 116, an interlayer protective film 124, an upper planarization layer 126, and the upper protective film 128 may be sequentially stacked on the thin film transistor 100. Each of the lower protective film 118, the interlayer protective film 124 and the upper protective film 128 may be formed of an inorganic insulating material, such as $SiN_x$, SiON, or $SiO_2$. Each of the lower planarization layer 116 and the upper planarization layer 126 may be formed of a photoacryl, parylene, or siloxane-based organic insulating material. For example, each of the lower planarization layer 116 and the upper planarization layer 126 may be formed of an organic insulating material that does not require a light exposure process. Embodiments are not limited to these examples. Therefore, the lower protective film 118 formed of an inorganic insulating material may be between the thin film transistor 100 and the lower planarization layer 116 formed of an organic insulating material, and the interlayer protective film 124 formed of an inorganic insulating material may be between the touch sensing line TSL and the upper planarization layer 126 formed of an organic insulating material. The lower protective film 118 and the interlayer protective film 124 formed of inorganic insulating materials may have excellent adhesive strength with the thin film transistor 100 and the touch sensing line TSL, as compared to the lower and upper planarization layers 116 and 126 formed of organic insulating materials. Therefore, separation of the lower protective film 118 and the interlayer protective film 124 from the upper surfaces of the thin film transistor 100 and the touch sensing line TSL may be reduced or prevented. Thus, oxidation of the thin film transistor 100 and the touch sensing line TSL may be reduced or prevented.

The pixel electrode 122 may be conductively connected to the drain electrode 110 exposed through a pixel contact hole 120 formed through the lower protective film 118, the lower planarization layer 116, the interlayer protective film 124, and the upper planarization layer 126. The pixel electrode 122 may directly contact the side surface of each of the lower protective film 118, the lower planarization layer 116, the interlayer protective film 124, and the upper planarization layer 126, exposed through the pixel contact hole 120. Here, the side surface of the lower planarization layer 116 formed of an organic insulating material and the side surface of the upper planarization layer 126 formed of an organic insulating material may be exposed through the same pixel contact hole 120. Therefore, embodiments of the present disclosure may reduce or minimize the number of necessary pixel contact holes 120 and, thus, may reduce an area occupied by the pixel contact holes 120 and improve an aperture ratio.

The common electrode block 132 may be formed on the upper protective film 128 of each pixel area to have a plurality of slits 130. The common electrode block 132 may overlap the pixel electrode 122 with the upper protective film 128 disposed therebetween in each pixel area, and thus may form a fringe field. Thereby, during the image display period, a common voltage may be supplied to the common electrode block 132, the common electrode block 132, to which the common voltage may be supplied, may form the fringe field with the pixel electrode 122 to which a pixel voltage signal may be supplied, and, thus, liquid crystal molecules between the thin film transistor substrate and the color filter substrate may be rotated by dielectric anisotropy. Further, light transmissivity of the pixel area may be varied according to a degree of rotation of the liquid crystal molecules and, thus, gradation may be implemented.

Further, the common electrode blocks 132 may serve as touch electrodes that may sense a user's touch position during the touch sensing period, e.g., the image non-display period. As such, each common electrode block 132 may be connected to one of the touch sensing lines TSL traversing the common electrode block 132. For example, the common electrode block 132 shown in FIG. 3 may be connected to a first touch sensing line TSL1 out of first to third touch sensing lines TSL1, TSL2, and TSL3. For example, each common electrode block 132 may be connected to one of the touch sensing lines TSL through a common connection electrode 162. That is, the touch sensing line TSL may be on the lower planarization layer 116, exposed through a first touch contact hole 166 formed through the interlayer protective film 124 and the upper planarization layer 126, and may be connected to the common connection electrode 162 on the upper planarization layer 126. The common connection electrode 162 may be exposed through a second touch contact hole 168 formed through the upper protective film 128, and may be connected to the common electrode block 132 on the upper protective film 128.

Each common electrode block 132 may be not connected to the remaining touch sensing lines TSL, except for one of the touch sensing lines TSL traversing the common electrode block 132. For example, the common electrode block 132 shown in FIG. 3 may be not connected to the second and third touch sensing lines TSL2 and TSL3, except for the first touch sensing line TSL1 out of the first to third touch sensing lines TSL1, TSL2, and TSL3. For example, among the touch sensing lines TSL traversing each common electrode block 132, the remaining touch sensing lines TSL that are not connected to the common electrode block 132 may overlap the common electrode block 132 with the interlayer protective film 124 formed of an inorganic insulating material, the upper planarization layer 126 formed of an organic insulating material, and the upper protective film 128 formed of an inorganic insulating material disposed therebetween. Therefore, a distance between the touch sensing lines TSL and the common electrode blocks 132 may be increased by the thickness of the upper planarization layer 126 formed of an organic insulating material. Thus, parasitic capacitance Cc generated between the touch sensing lines TSL and the common electrode blocks 132 may be reduced. A touch driving load may be reduced as much as the reduction in the parasitic capacitance Cc. Thus, accuracy in touch sensing may be improved.

As such, the common electrode block 132 and the pixel electrodes 122 may be spaced apart from each other with the upper protective film 128 formed of an inorganic insulating material therebetween. Further, the touch sensing lines TSL and the common electrode block 132 may be spaced apart from each other with the interlayer protective film 124 and the upper protective film 128 formed of inorganic insulating materials and the upper planarization layer 126 formed of an organic insulating material disposed therebetween. Therefore, in an embodiment of the present disclosure, parasitic capacitance generated between the touch sensing lines TSL and the common electrode blocks 132 may be reduced without reduction in liquid crystal capacitance and storage capacitance generated between the common electrode blocks 132 and the pixel electrodes 122.

FIGS. 5A to 5E are cross-sectional views illustrating a method of manufacturing the display panel shown in FIG. 4.

With reference to FIG. 5A, the lower protective film 118 and the lower planarization layer 116 may be sequentially formed on the substrate 101 provided with the thin film transistors 100, the data lines DL, the gate pad lower electrodes 192, the common pad lower electrodes 172, and the data pad lower electrodes 182 formed thereon. Then, the touch sensing lines TSL may be formed on the lower planarization layer 116.

For example, the entire upper surface of the substrate 101 provided with the thin film transistors 100, the data lines DL, the gate pad lower electrodes 192, the common pad lower electrodes 172, and the data pad lower electrodes 182 formed thereon may be sequentially coated with an inorganic insulating material and an organic insulating material through at least three mask processes, thus forming the lower protective film 118 and the lower planarization layer 116. Here, the lower protective film 118 uses an inorganic insulating material, such as $SiN_x$, SiON, or $SiO_2$, and the lower planarization layer 116 may use a photoacryl, parylene, or siloxane-based organic insulating material. Thereafter, an opaque conductive layer may be deposited on the entire upper surface of the lower planarization layer 116, and may then be patterned through a mask process, such as a photolithography process and an etching process. Thereby, the touch sensing lines TSL may be formed on the lower planarization layer 116. Here, the touch sensing lines TSL may be formed of an opaque conductive layer having a monolayer or multilayer structure using one or more metal among: aluminum (Al), titanium (Ti), copper (Cu), molybdenum (Mo), tantalum (Ta), and MoTi. Embodiments are not limited to these examples.

With reference to FIG. 5B, the interlayer protective film 124 and the upper planarization layer 126 may be formed on the substrate 101 provided with the touch sensing lines TSL thereon. Then, the first the pixel contact holes 120 and the first touch contact holes 166 may be formed therethrough.

For example, the entire upper surface of the substrate 101, with the touch sensing lines TSL thereon, may be sequentially coated with an inorganic insulating material and an organic insulating material, thus forming the interlayer protective film 124 and the upper planarization layer 126. Here, the interlayer protective film 124 may use an inorganic insulating material, such as $SiN_x$, SiON, or $SiO_2$, and the upper planarization layer 126 may use a photoacryl, parylene, or siloxane-based organic insulating material. Thereafter, a conductive layer may be deposited on the entire upper surface of the upper planarization layer 126, and then a photoresist pattern 138 may be formed through a photolithography process. The conductive layer may be patterned through an etching process using the photoresist pattern, thus forming a hard mask layer 136. The hard mask layer 136 may use one or more of: indium tin oxide (ITO), MoTi, and Al. Thereafter, the upper planarization layer 126, the interlayer protective film 124, the lower planarization layer 116, and the lower protective film 118 may be patterned through a dry etching process using the photoresist pattern 138 and the hard mask layer 136 as a mask. As such, the pixel contact holes 120 and the first touch contact holes 166 may be formed, and the data pad lower electrodes 182 and the gate insulating film 112 in the bezel area BA may be exposed. Here, the pixel contact holes 120 may be formed through the upper planarization layer 126, the interlayer protective film 124, the lower planarization layer 116, and the lower protective film 118, and thus may expose the drain electrodes 110. The first touch contact holes 166 may be formed through the upper planarization layer 126 and the interlayer protective film 124, and thus may expose the touch sensing lines TSL. The hard mask layer 136 may be used as an etching mask during the etching process of at least one of the lower or upper planarization layer 116 or 126 having a large thickness. Therefore, even if the photoresist pattern 138 is damaged during the etching process of at least one of the lower or upper planarization layer 116 or 126, at least one of the lower or upper planarization layer 116 or 126 may be etched using the hard mask layer 136 as a mask, and the pixel contact holes 120 and the first touch contact holes 166 may be stably formed.

Figure 5C:
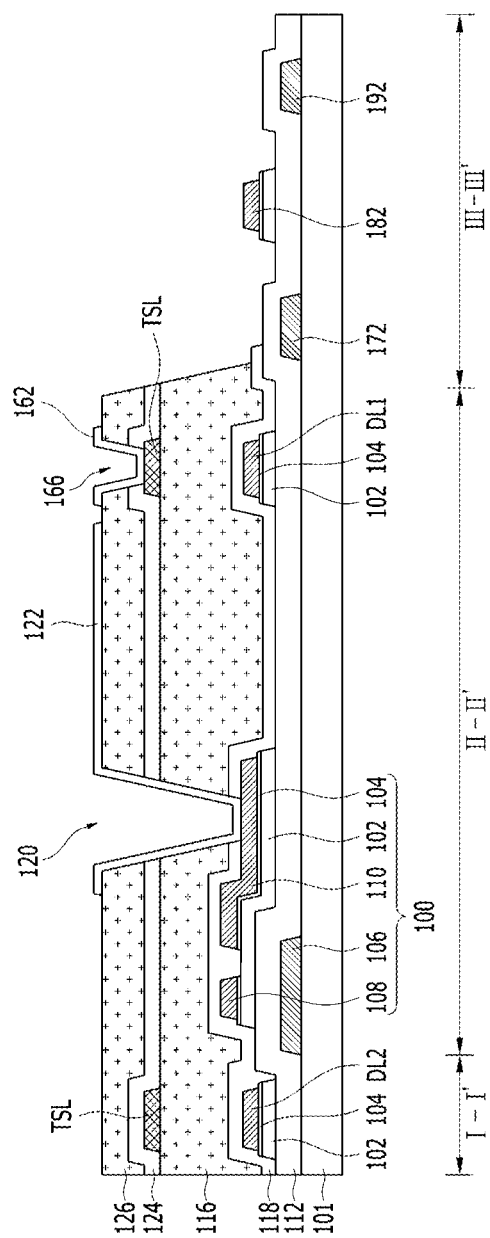

With reference to FIG. 5C, the pixel electrodes 122 and the common connection electrodes 162 may be formed on the substrate 101 including the pixel contact holes 120 and the first touch contact holes 166. For example, the hard mask layer 136 remaining on the substrate 101, with the pixel contact holes 120 and the first touch contact holes 166 thereon, may be removed. Then, a transparent conductive layer may be deposited on the entire upper surface of the substrate 101. Thereafter, the transparent conductive layer may be patterned through a photolithography process and an etching process, thus forming the pixel electrodes 122 and the common connection electrodes 162.

With reference to FIG. 5D, the upper protective film 128, including the second touch contact holes 168, the gate contact holes 196, the data contact holes 186, and the common contact holes 176, may be formed on the substrate 101 provided with the pixel electrodes 122 and the common connection electrodes 162. For example, the upper protective film 128 using an inorganic insulating material, such as $SiN_x$, SiON, or $SiO_2$, may be formed on the entire upper surface of the substrate 101 provided with the pixel electrodes 122 and the common connection electrodes 162 formed thereon. Thereafter, the upper protective film 128 may be patterned through a photolithography process and an etching process, thus forming the second touch contact holes 168, the gate contact holes 196, the data contact holes 186, and the common contact holes 176.

With reference to FIG. 5E, the common electrode blocks 132, the gate pad upper electrodes 194, the data pad upper electrodes 184, and the common pad upper electrodes 174 may be formed on the substrate 101 including the second touch contact holes 168, the gate contact holes 196, the data contact holes 186, and the common contact holes 176. For example, a transparent conductive layer may be deposited on the entire upper surface of the substrate 101 including the second touch contact holes 168, the gate contact holes 196, the data contact holes 186, and the common contact holes 176. Thereafter, the transparent conductive layer may be patterned through a photolithography process and an etching process, thus forming the common electrode blocks 132, the gate pad upper electrodes 194, the data pad upper electrodes 184, and the common pad upper electrodes 174.

Figure 6:
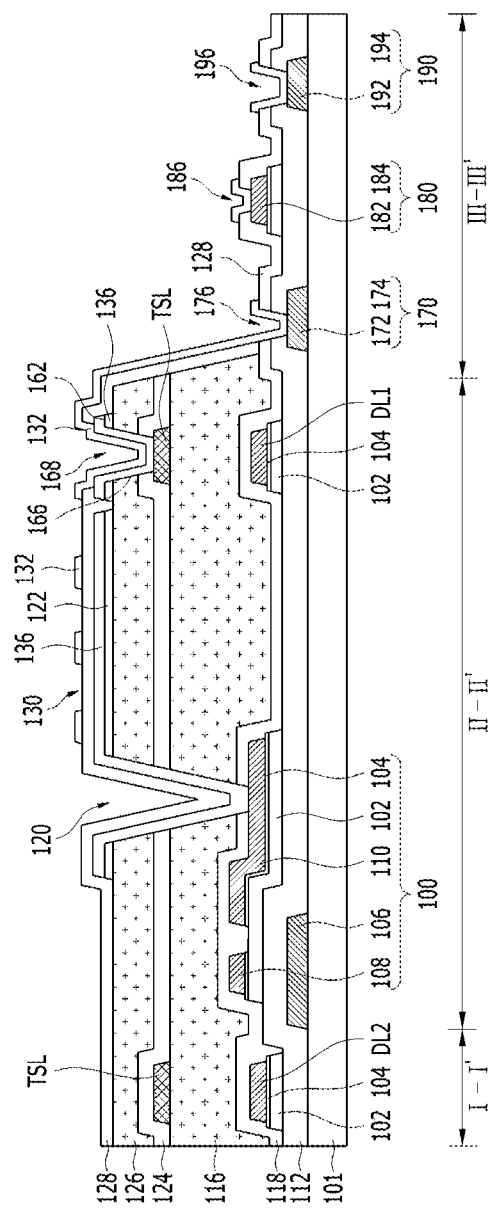
FIG. 6 is a plan view illustrating a display panel including touch sensors in accordance with another example embodiment of the present disclosure.

FIG. 6 is a plan view illustrating a display panel including touch sensors in accordance with another example embodiment of the present disclosure.

The display panel in accordance with the example embodiment shown in FIG. 6 may include substantially similar elements as the display panel in accordance with the example embodiment shown in FIG. 4, except that a hard mask layer 136 may be further provided. Therefore, a detailed description of the elements of the display panel in accordance with this example embodiment that are the same as those of the display panel in accordance with the earlier example embodiment will be omitted.

The hard mask layer 136 may be between each of pixel electrodes 122 and common connection electrodes 162 and an upper planarization layer 126, and may overlap the pixel electrodes 122 and the common connection electrodes 162. The hard mask layer 136 may include openings in regions overlapping pixel contact holes 120 and first touch contact holes 166. Therefore, the hard mask layer 136 may be only on the upper surface of the upper planarization layer 126.

The hard mask layer 136 may be formed of a material that may withstand etching gas used to form the pixel contact holes 120 and the first touch contact holes 166. For example, the hard mask layer 136 may be formed to have a monolayer or multilayer structure, including one or more of: ITO, MoTi and Al, which may react with an etching solution of a wet etching process. Embodiments are not limited to these examples.

The hard mask layer 136 may be used as an etching mask during an etching process of at least one of a lower or upper planarization layer 116 or 126 having a large thickness. Therefore, even if a photoresist pattern is damaged during the etching process of at least one of the lower or upper planarization layer 116 or 126, at least one of the lower or upper planarization layer 116 or 126 may be etched using the hard mask layer 136 as a mask, and the pixel contact holes 120 and the first touch contact holes 166 may be stably formed.

Figure 7A:
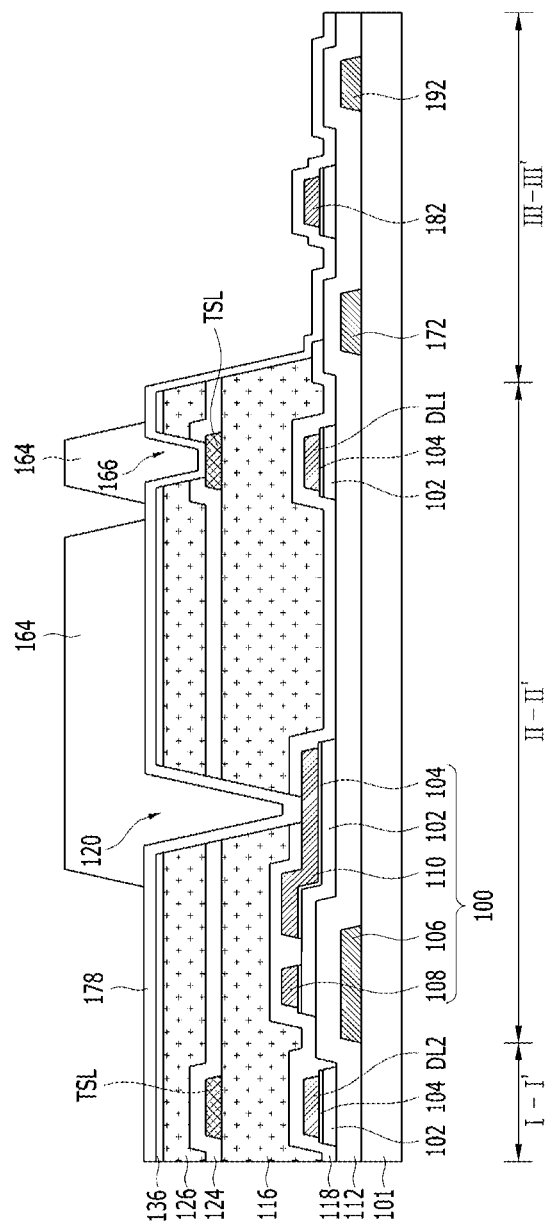
FIGS. 7A to 7C are cross-sectional views illustrating a method of manufacturing pixel electrodes and common connection electrodes shown in FIG. 6.
Figure 7B:
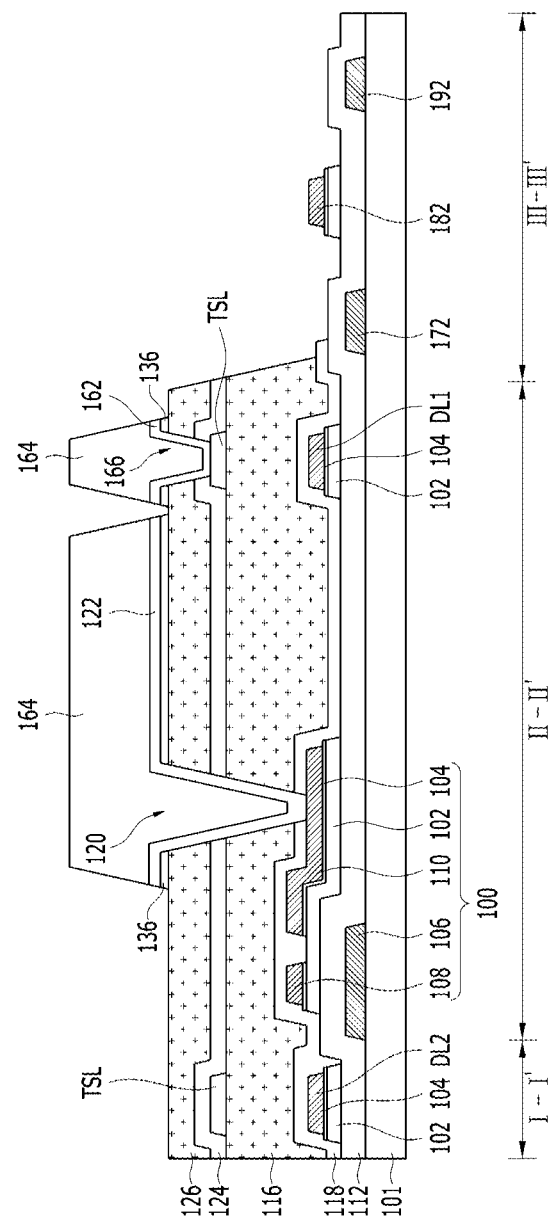
Figure 7C:
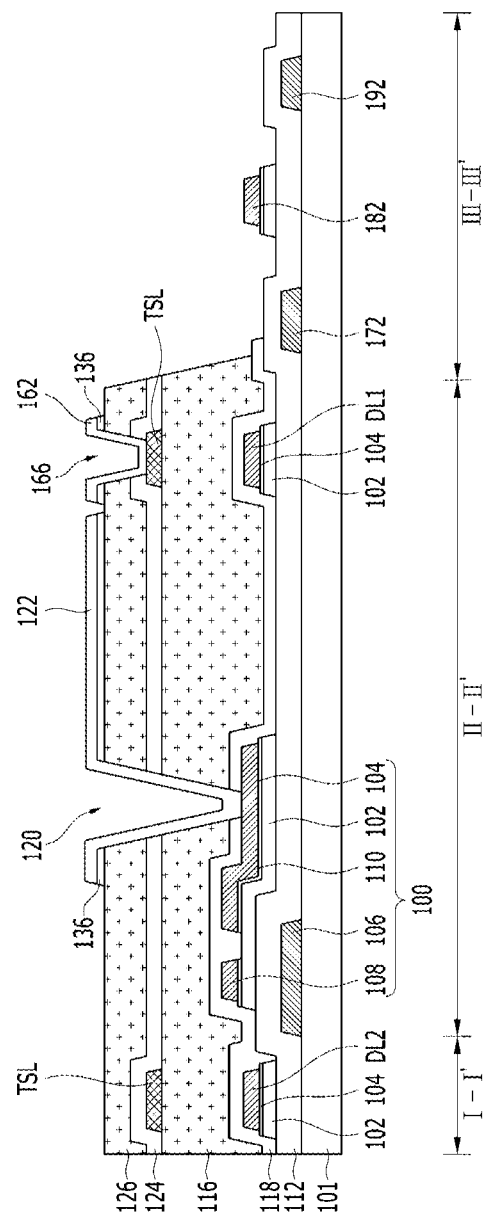

FIGS. 7A to 7C are cross-sectional views illustrating a method of manufacturing pixel electrodes and common connection electrodes shown in FIG. 6.

First, as shown in the example of FIG. 5B, by patterning the upper planarization layer 126, the interlayer protective film 124, the lower planarization layer 116, and the lower protective film 118 through a dry etching process using the photoresist pattern 138 and the hard mask layer 136 as a mask, the pixel contact holes 120 and the first touch contact holes 166 may be formed, and the data pad lower electrodes 182 and the gate insulating film 112 in the bezel area BA may be exposed. Thereafter, a transparent conductive layer 178 may be deposited on the entire upper surface of the substrate 101 provided with the remainder of the hard mask layer 136 formed thereon, as shown in the example of FIG. 7A. Thereafter, by patterning the transparent conductive mask layer 178 and the hard mask layer 136 through an etching process using a photoresist pattern 164 formed through a photolithography process, the pixel electrodes 122 and the common connection electrodes 162 may be formed, and the hard mask layer 136 may be under only the pixel electrodes 122 and the common connection electrodes 162, as shown in the example of FIG. 7B. Thereafter, the photoresist pattern 164 remaining on the pixel electrodes 122 and the common connection electrodes 162 may be removed through a stripping process, as shown in the example of FIG. 7C.

Figure 8:
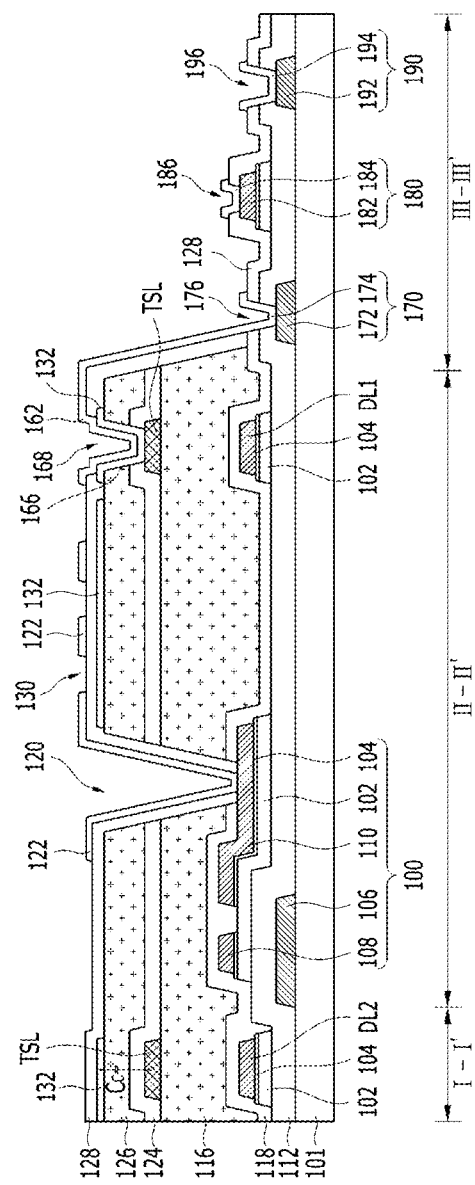
FIG. 8 is a cross-sectional view illustrating another embodiment of the pixel electrodes and common electrode blocks shown in FIG. 6.

FIG. 8 is a cross-sectional view illustrating another embodiment of the pixel electrodes and common electrode blocks shown in FIG. 6.

Although an example structure in which the pixel electrodes 122 are below the common electrode blocks 132 is described above, the common electrode blocks 132 may be below the pixel electrodes 122, as shown in the example of FIG. 8. That is, the common electrode blocks 132 may be on the upper planarization layer 126, and the pixel electrodes 122 may be on the upper protective film 128, and may cover the common electrode blocks 132. In this case, the common electrode blocks 132 may overlap the touch sensing lines TSL, with the interlayer protective film 124 and the upper planarization layer 126 therebetween, thus reducing parasitic capacitance between the common electrode blocks 132 and the touch sensing lines TSL. Further, the upper protective film 128 may contact the side surface of each of the lower protective film 118, the lower planarization layer 116, the interlayer protective film 124, and the upper planarization layer 126, exposed through the pixel contact hole 120. Here, the side surface of the lower planarization layer 116 formed of an organic insulating material and the side surface of the upper planarization layer 126 formed of an organic insulating material may be exposed through the same pixel contact hole 120. Therefore, embodiments of the present disclosure may reduce or minimize the number of necessary pixel contact holes 120 and, thus, may reduce an area occupied by the pixel contact holes 120 and improve an aperture ratio.

As apparent from the above description, in a display device including touch sensors in accordance with an embodiment of the present disclosure, common electrode blocks and pixel electrodes may be spaced apart from each other with an upper protective film formed of an inorganic insulating material, disposed therebetween, and touch sensing lines and the common electrode blocks may be spaced apart from each other with an interlayer protective film and the upper protective film formed of inorganic insulating materials and an upper planarization layer formed of an organic insulating material, disposed therebetween. Therefore, in an embodiment of the present disclosure, parasitic capacitance generated between the touch sensing lines and the common electrode blocks may be reduced without reduction in liquid crystal capacitance and storage capacitance generated between the common electrode blocks and the pixel electrodes.

Further, in an embodiment of the present disclosure, the side surface of a lower planarization layer formed of an organic insulating material and the side surface of the upper planarization layer formed of an organic insulating material may be exposed through the same pixel contact hole. Thus, the pixel electrode may be conductively connected to a drain electrode exposed through one pixel contact hole. Therefore, the display device in accordance with an embodiment of the present disclosure may reduce or minimize the number of necessary pixel contact holes and, thus, may reduce an area occupied by the pixel contact holes and improve an aperture ratio.

It will be apparent to those skilled in the art that various modifications and variations may be made in the present disclosure without departing from the technical idea or scope of the disclosure. Thus, it is intended that embodiments of the present disclosure cover the modifications and variations of the disclosure provided they come within the scope of the appended claims and their equivalents.

What is claimed is:
1. A display device including touch sensors, comprising:
a substrate;
a plurality of thin film transistors on the substrate;
a plurality of pixel electrodes respectively connected to the plurality of thin film transistors;
a plurality of common electrode blocks on the substrate, each of the plurality of common electrode blocks being configured to form an electric field with respective ones of the plurality of pixel electrodes;

a plurality of touch sensing lines respectively connected to the plurality of common electrode blocks;

a lower planarization layer between the thin film transistors and the touch sensing lines;

an interlayer protective film on the touch sensing lines;

an upper planarization layer between the plurality of touch sensing lines and one of: the plurality of pixel electrodes and the plurality of common electrode blocks;

an upper protective film between the plurality of pixel electrodes and the plurality of common electrode blocks; and a plurality of pixel contact holes extending through the lower planarization layer and the upper planarization layer to expose respective drain electrodes of the plurality of thin film transistors, wherein a side surface of each of the lower planarization layer and the upper planarization layer, exposed through the plurality of pixel contact holes, contacts one of: the upper protective film and the plurality of pixel electrodes, and wherein the interlayer protective film, the upper planarization layer, and the upper protective film are between the plurality of common electrode blocks and the touch sensing lines.

2. The display device of claim 1, further comprising:

a lower protective film between the plurality of thin film transistors and the lower planarization layer; and wherein the interlayer protective film is between the plurality of touch sensing lines and the upper planarization layer.

3. The display device of claim 2, wherein:

each of the upper planarization layer and the lower planarization layer comprises an organic insulating material; and each of the lower protective film, the interlayer protective film, and the upper protective film comprises an inorganic insulating material.

4. The display device of claim 3, wherein:

one of the plurality of touch sensing lines traversing each of the plurality of common electrode blocks is exposed through a touch contact hole through the interlayer protective film and the upper planarization layer, and is connected to a corresponding common electrode block; and all others of the plurality of touch sensing lines traversing the corresponding common electrode block, other than the one of the plurality of touch sensing lines, overlap the corresponding common electrode block with the interlayer protective film and the upper planarization layer therebetween.

5. The display device of claim 4, wherein:

the plurality of pixel electrodes are on the upper planarization layer;

the plurality of common electrode blocks are on the upper protective film that covers the pixel electrodes; and each of the plurality of pixel electrodes contacts a side surface of each of the lower protective film, the lower planarization layer, the interlayer protective film, and the upper planarization layer exposed through the pixel contact hole.

6. The display device of claim 4, wherein:

the plurality of common electrode blocks are on the upper planarization layer;

the plurality of pixel electrodes are on the upper protective film that covers the plurality of common electrode blocks; and the upper protective film contacts a side surface of each of the lower protective film, the lower planarization layer, the interlayer protective film, and the upper planarization layer exposed through the plurality of pixel contact holes.

7. The display device of claim 1, further comprising a hard mask layer between the plurality of pixel electrodes and the upper planarization layer to overlap the plurality of pixel electrodes.

8. The display device of claim 7, wherein the hard mask layer comprises openings in regions overlapping the plurality of pixel contact holes.

9. The display device of claim 7, further comprising a common connection electrode connected to the plurality of common electrode blocks and the plurality of touch sensing lines.

10. The display device of claim 9, wherein the hard mask is between the common connection electrode and the upper planarization layer, and overlaps the common connection electrode.

11. A method of manufacturing a display device including touch sensors, the method comprising:

providing a substrate;

providing a plurality of thin film transistors on the substrate;

providing a plurality of pixel electrodes respectively connected to the plurality of thin film transistors;

providing a plurality of common electrode blocks on the substrate, each of the plurality of common electrode blocks being configured to form an electric field with respective ones of the plurality of pixel electrodes;

providing a plurality of touch sensing lines respectively connected to the plurality of common electrode blocks;

providing a lower planarization layer between the thin film transistors and the touch sensing lines;

providing an interlayer protective film on the touch sensing lines;

providing an upper planarization layer between the plurality of touch sensing lines and one of: the plurality of pixel electrodes and the plurality of common electrode blocks;

providing an upper protective film between the plurality of pixel electrodes and the plurality of common electrode blocks; and providing a plurality of pixel contact holes extending through the lower planarization layer and the upper planarization layer to expose respective drain electrodes of the plurality of thin film transistors, wherein a side surface of each of the lower planarization layer and the upper planarization layer, exposed through the plurality of pixel contact holes, contacts one of: the upper protective film and the plurality of pixel electrodes, and wherein the interlayer protective film, the upper planarization layer, and the upper protective film are between the plurality of common electrode blocks and the touch sensing lines.

12. The method of claim 11, further comprising:

providing a lower protective film between the plurality of thin film transistors and the lower planarization layer; and wherein the interlayer protective film is between the plurality of touch sensing lines and the upper planarization layer.

13. The method of claim 12, wherein:
each of the upper planarization layer and the lower planarization layer comprises an organic insulating material; and
each of the lower protective film, the interlayer protective film, and the upper protective film comprises an inorganic insulating material.

14. The method of claim 13, wherein:
one of the plurality of touch sensing lines traversing each of the plurality of common electrode blocks is exposed through a touch contact hole through the interlayer protective film and the upper planarization layer, and is connected to a corresponding common electrode block; and
all others of the plurality of touch sensing lines traversing the corresponding common electrode block, other than the one of the plurality of touch sensing lines, overlap the corresponding common electrode block with the interlayer protective film and the upper planarization layer therebetween.

15. The method of claim 14, wherein:
the plurality of pixel electrodes are on the upper planarization layer;
the plurality of common electrode blocks are on the upper protective film that covers the pixel electrodes; and
each of the plurality of pixel electrodes contacts a side surface of each of the lower protective film, the lower planarization layer, the interlayer protective film, and the upper planarization layer exposed through the pixel contact hole.

16. The method of claim 14, wherein:
the plurality of common electrode blocks are on the upper planarization layer;
the plurality of pixel electrodes are on the upper protective film that covers the plurality of common electrode blocks; and
the upper protective film contacts a side surface of each of the lower protective film, the lower planarization layer, the interlayer protective film, and the upper planarization layer exposed through the plurality of pixel contact holes.

17. The method of claim 11, further comprising providing a hard mask layer between the plurality of pixel electrodes and the upper planarization layer to overlap the plurality of pixel electrodes.

18. The method of claim 17, wherein the hard mask layer comprises openings in regions overlapping the plurality of pixel contact holes.

19. The method of claim 17, further comprising providing a common connection electrode connected to the plurality of common electrode blocks and the plurality of touch sensing lines.

20. The method of claim 19, wherein the hard mask is between the common connection electrode and the upper planarization layer, and overlaps the common connection electrode.

* * * * *